US008643362B2

(12) United States Patent
Sekiguchi et al.

(10) Patent No.: US 8,643,362 B2
(45) Date of Patent: Feb. 4, 2014

(54) MAGNETIC RESONANCE IMAGING APPARATUS HAVING CONTROLLER THAT SETS CARRIER FREQUENCIES OUTSIDE DETECTED INTERFERENCE BANDS

(75) Inventors: Takahiro Sekiguchi, Yokohama (JP); Koji Akita, Yokohama (JP); Toshiyuki Nakanishi, Yokohama (JP); Kazuya Okamoto, Saitama (JP); Sojuro Kato, Nasushiobara (JP)

(73) Assignee: Kabushiki Kaisha Toshiba, Minato-ku, Tokyo (JP)

( * ) Notice: Subject to any disclaimer, the term of this patent is extended or adjusted under 35 U.S.C. 154(b) by 351 days.

(21) Appl. No.: 13/048,314

(22) Filed: Mar. 15, 2011

(65) Prior Publication Data
US 2011/0227571 A1    Sep. 22, 2011

(30) Foreign Application Priority Data

Mar. 16, 2010    (JP) .................................. 2010-059803

(51) Int. Cl.
*G01R 33/44*    (2006.01)
(52) U.S. Cl.
USPC ............ 324/307; 324/309; 324/316; 324/318
(58) Field of Classification Search
USPC .................... 324/300–322; 455/423
See application file for complete search history.

(56) References Cited

U.S. PATENT DOCUMENTS

| 5,384,536 A | 1/1995 | Murakami et al. ............ 324/309 |
| 5,845,209 A * | 12/1998 | Iwata ............................. 455/423 |
| 2009/0322335 A1 * | 12/2009 | Adachi et al. ................. 324/318 |
| 2010/0037082 A1 * | 2/2010 | Sakamoto et al. ............ 713/502 |
| 2010/0117649 A1 * | 5/2010 | Nakanishi et al. ............ 324/318 |
| 2011/0101977 A1 * | 5/2011 | Nakanishi et al. ............ 324/307 |

* cited by examiner

*Primary Examiner* — Melissa Koval
*Assistant Examiner* — Rishi Patel
(74) *Attorney, Agent, or Firm* — Ohlandt, Greeley, Ruggiero & Perle, L.L.P.

(57) ABSTRACT

According to one embodiment, a apparatus includes a coil, a clock generator, an echo transmitter, a carrier generator, a clock transmitter, a regenerator, an receiver, a reconstructor, a detector, and a controller. The echo transmitter generates and transmits an echo transmission signal synchronously with a clock signal generated by the clock generator to wirelessly transmit an echo signal output from the col. The carrier generator generates a carrier signal have a frequency within a variable range. The clock transmitter wirelessly transmits a clock transmission signal. The regenerator regenerates the clock signal based on the transmitted clock transmission signal. The receiver extracts the echo signal synchronously with the regenerated clock signal from the transmitted echo transmission signal. The detector detects a frequency of an interference wave. The controller controls the carrier generator to generate the carrier signal having a frequency which comparatively small interference with respect to the detected frequency.

7 Claims, 8 Drawing Sheets

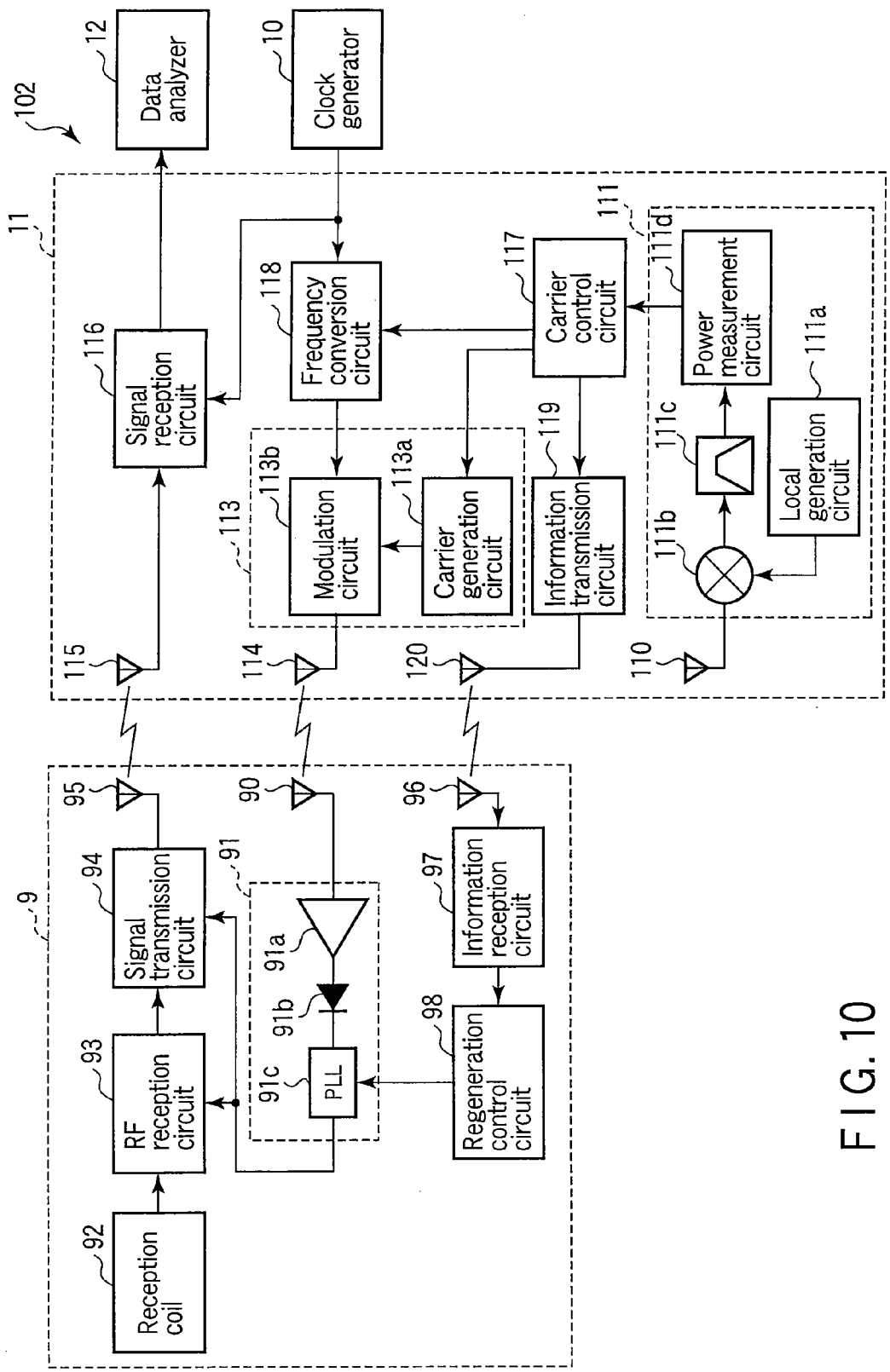
F I G. 10

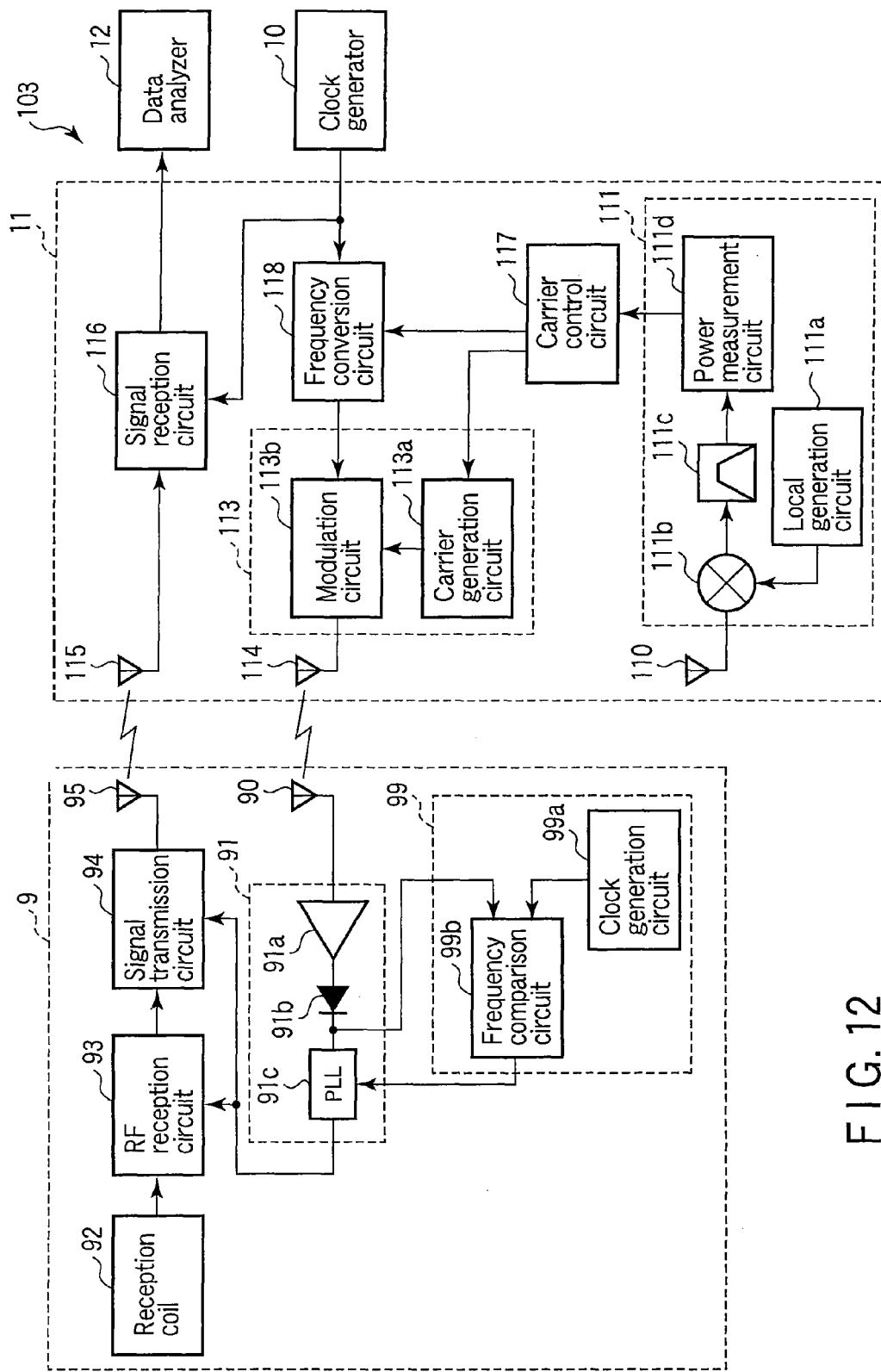
F I G. 12

MAGNETIC RESONANCE IMAGING APPARATUS HAVING CONTROLLER THAT SETS CARRIER FREQUENCIES OUTSIDE DETECTED INTERFERENCE BANDS

CROSS-REFERENCE TO RELATED APPLICATIONS

This application is based upon and claims the benefit of priority from Japanese Patent Application No. 2010-059803, filed Mar. 16, 2010; the entire contents of which are incorporated herein by reference.

FIELD

Embodiments described herein relate generally to a magnetic resonance imaging apparatus.

BACKGROUND

In a magnetic resonance imaging apparatus, an echo signal obtained at a reception coil is transmitted from a coil side unit to a system side unit. In this case, a digital signal obtained by digitalizing the echo signal is wirelessly transmitted, whereby the reception coil is made to be wireless. This system is known from U.S. Pat. No. 5,384,536 (hereinafter referred to as Reference 1).

When the echo signal is digitalized in this manner, it is necessary to use a clock signal having the same frequency in transmission processing and reception processing of the digital signal. If a frequency shift occurs in the clock signal, the echo signal deteriorates, and accuracy of an image reconstructed from this echo signal might lower.

In Reference 1, a first clock signal which is used for the reception processing is wirelessly transmitted as a reference signal. On the basis of this reference signal, a second clock signal is generated which is used in the transmission processing.

In a case where the system of Reference 1 is used, the second clock signal can accurately be synchronized with the first clock signal, if the reference signal is transmitted without any deterioration. However, usually in the wireless transmission, ambient electric waves function as interference waves, and hence the deterioration occurs. For example, a 2.4 GHz band (2400 to 2483.5 MHz) can be utilized without any restriction of a band width and a modulation system, if it does not exceed a regulated electric intensity. The regulated electric intensity is 50 mV/m in the United States and 10 mW in Europe at a distance of 3 m. The above frequency band is sufficiently distant from the frequency (about 64 MHz) of the echo signal, and includes a frequency which permits easy diode detection. Accordingly, the above frequency band is considered to be suitable as a carrier frequency of the clock signal. However, the above frequency band is used in wireless communication systems such as wireless LAN and Bluetooth (registered trademark), and in various use applications as an ISM band. Hence, the electric waves used in these use applications might function as the interference waves.

In view of such situations, it has been desired to decrease influence of the interference by the other electric waves.

BRIEF DESCRIPTION OF THE DRAWINGS

FIG. 10 is a block diagram of a magnetic resonance imaging apparatus according to a fourth embodiment;

FIG. 12 is a block diagram of a magnetic resonance imaging apparatus according to a fifth embodiment.

DETAILED DESCRIPTION

In general, according to one embodiment, a magnetic resonance imaging apparatus includes: a reception coil, a clock generator, an echo transmitter, a carrier generator, a clock transmitter, a regenerator, an echo receiver, a reconstructor, a detector, and a controller. The coil which receives a magnetic resonance echo emitted from a subject, to output an echo signal. The clock generator which generates a clock signal. The echo transmitter which generates and transmits an echo transmission signal to wirelessly transmit the echo signal, and performs at least a part of processing to generate the echo transmission signal synchronously with the clock signal. The carrier generator generates a carrier signal, a frequency of the carrier signal being configured to be changed within a variable range. The clock transmitter wirelessly transmits a clock transmission signal obtained by modulating the carrier signal with the clock signal. The regenerator regenerates the clock signal based on the clock transmission signal transmitted by the clock transmitter. The echo receiver extracts the echo signal from the echo transmission signal transmitted by the echo transmitter, and performs a part of processing to extract the echo signal synchronously with the clock signal regenerated by the regenerator. The reconstructor reconstructs an image concerning the subject based on the echo signal extracted by the receiver. The detector which detects a frequency of an electric wave which becomes an interference wave of the clock transmission signal. The a controller selects, from the variable range, a frequency having comparatively small interference with respect to the frequency detected by the detector, and controls the carrier generator to generate the carrier signal having the selected frequency.

Hereinafter, embodiments will be described with reference to the drawings.

First Embodiment

Figure 1:
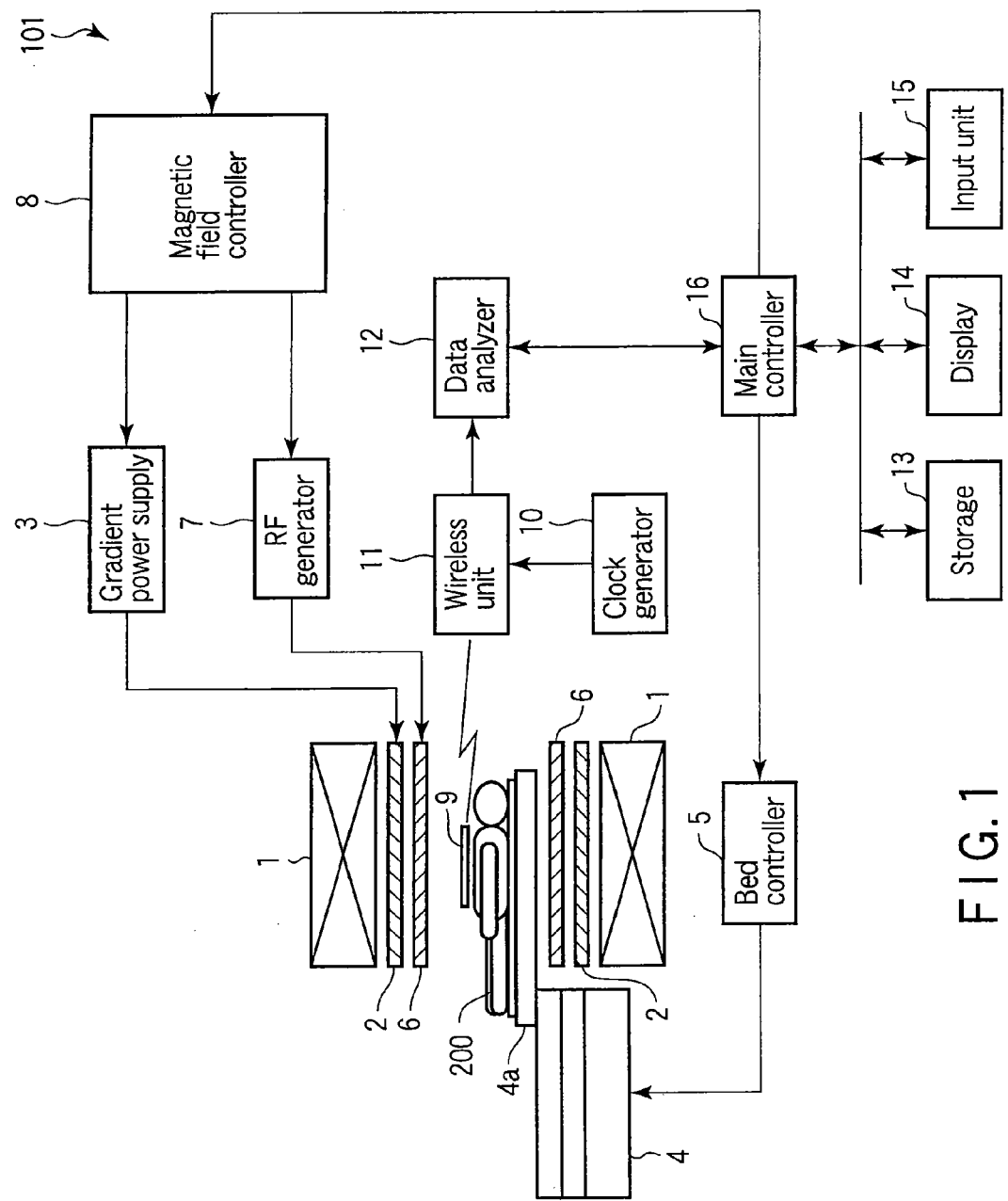
FIG. 1 is a diagram showing a constitution of a magnetic resonance imaging apparatus according to a first embodiment.

FIG. 1 is a diagram showing a constitution of a magnetic resonance imaging apparatus 101 according to a first embodiment.

The magnetic resonance imaging apparatus (hereinafter referred to as the MRI apparatus) 101 comprises a static magnet 1, a gradient coil 2, a gradient power supply 3, a bed 4, a bed controller 5, a transmission coil unit 6, an RF generator 7, a magnetic fields controller 8, a coil side unit 9, a clock generator 10, a wireless unit 11, a data analyzer 12, a storage 13, a display 14, an input unit 15 and a main controller 16. It is to be noted that among these units, the units other than the coil side unit 9 are disposed in a system side unit which is separated from the coil side unit 9. It is to be noted that the system side unit may be divided into a gantry and a processing unit. In this case, for example, the static magnet 1, the gradient coil 2, the gradient power supply 3, the bed 4, the bed controller 5, the transmission coil unit 6, the RF generator 7, the magnetic fields controller 8 and the wireless unit 11 are disposed in the gantry, and the clock generator 10, the data analyzer 12, the storage 13, the display 14, the input unit 15 and the main controller 16 are disposed in the processing unit.

The static magnet 1 has a hollow cylindrical shape, and generates a uniform static magnetic field in an internal space thereof. As the static magnet 1, for example, a permanent magnet, a superconducting magnet or the like can be used.

The gradient coil 2 has a hollow cylindrical shape, and is disposed in the static magnet 1. The gradient coil 2 is a combination of three types of coils corresponding to mutually orthogonal X, Y and Z-axes. In the gradient coil 2, the above three types of coils individually receive a current supplied from the gradient power supply 3, to generate gradient magnetic fields having a magnetic intensity which slants along the respective X, Y and Z-axes. It is to be noted that, for example, a Z-axis direction is the same as a static magnetic direction. The gradient magnetic fields along the respective X, Y and Z-axes correspond to, for example, gradient magnetic fields Gs, Ge and Gr for slice selection, phase encoding and readout, respectively. The gradient magnetic field Gs is utilized arbitrarily to determine an imaging slice. The gradient magnetic field Ge is utilized to change the phase of a magnetic resonance signal in accordance with a spatial position. The gradient magnetic field Gr is utilized to change the frequency of the magnetic resonance signal in accordance with the spatial position.

In the bed 4, a top plate 4a is moved in a longitudinal direction (a right-left direction in FIG. 1) and vertical direction thereof under the control of the bed controller 5. The bed 4 is usually installed so that the longitudinal direction thereof is parallel to the central axis of the static magnet 1. A subject 200 to be inspected is mounted on the top plate 4a. By moving the top plate 4a of the bed 4, the subject 200 is inserted into the internal space (an imaging space) of the gradient coil 2.

In the transmission coil unit 6, one or a plurality of coils are disposed in a cylindrical case. The transmission coil unit 6 is disposed in the gradient coil 2. The transmission coil unit 6 receives an RF pulse signal supplied from the RF generator 7, to emit an RF pulse.

The RF generator 7 generates the RF pulse signal.

The magnetic fields controller 8 controls the gradient power supply 3 so as to change each gradient magnetic field in accordance with a required pulse sequence under the control of the main controller 16. The magnetic fields controller 8 controls the RF generator 7 so as to generate the RF pulse in accordance with parameters set by the main controller 16 (hereinafter referred to as the RF parameters). It is to be noted that the RF parameters indicate the irradiation timing, phase, power, signal waveform and the like of the RF pulse.

The coil side unit 9 is mounted on the top plate 4a, incorporated in the top plate 4a, or attached to the subject 200. Moreover, during imaging, the coil side unit is inserted into the imaging space together with the subject 200, and receives a magnetic resonance echo emitted from the subject 200, to obtain an electric echo signal. The coil side unit 9 wirelessly transmits a signal for transmission including echo data obtained by digitalizing the echo signal.

The clock generator 10 generates a first clock signal having a predetermined frequency. This first clock signal is transmitted to the wireless unit 11. It is to be noted that the first clock signal may be used as a system clock which is a reference of the whole operation timing of the MRI apparatus 101.

The wireless unit 11 receives an electromagnetic wave emitted from the coil side unit 9, to obtain the signal for transmission. Then, the wireless unit 11 performs reception processing to extract the echo data from the signal for transmission. The wireless unit 11 performs the reception processing synchronously with the first clock signal.

The data analyzer 12 analyzes the echo data extracted by the wireless unit 11. Then, the data analyzer 12 reconstructs an image concerning the subject 200.

The storage 13 stores various pieces of data such as image data indicating the image reconstructed by the data analyzer 12.

The display 14 displays various types of information under the control of the main controller 16. The information to be displayed on the display 14 includes the image reconstructed by the data analyzer 12 and various operation screens for operation by a user of the MRI apparatus 101. As the display 14, a display device such as a liquid crystal display can be utilized.

The input unit 15 accepts various commands or information input by an operator. As the input unit 15, there can appropriately be utilized a pointing device such as a mouse or a track ball, a selection device such as a mode changeover switch, or an input device such as a keyboard.

The main controller 16 includes a CPU, a memory and the like (not shown), and totally controls the MRI apparatus 101.

Figure 2:
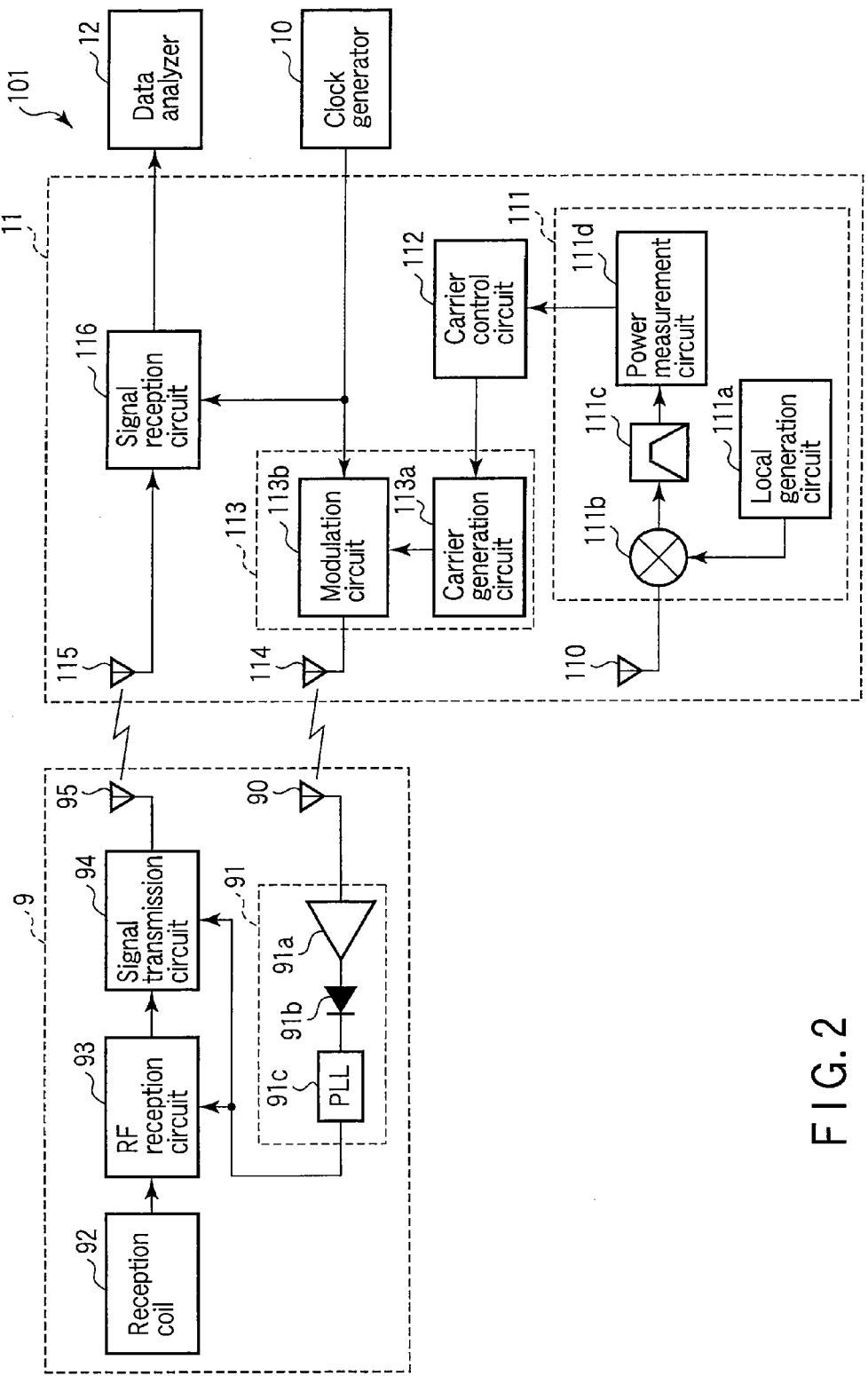
FIG. 2 is a block diagram of a coil side unit and a wireless unit in FIG. 1.

FIG. 2 is a block diagram of the coil side unit 9 and the wireless unit 11. It is to be noted that in FIG. 2, the same parts as in FIG. 1 are denoted with the same reference numerals.

The coil side unit 9 comprises a reception antenna 90, a clock reception circuit 91, a reception coil 92, an RF reception circuit 93, a signal transmission circuit 94 and a transmission antenna 95. Moreover, the wireless unit 11 includes a reception antenna 110, a carrier sense circuit 111, a carrier control circuit 112, a clock transmission circuit 113, a transmission antenna 114, a reception antenna 115 and a signal reception circuit 116.

The reception antenna 110 receives an incoming ambient electric wave to output an electric signal (hereinafter referred to as the ambient signal).

The carrier sense circuit 111 measures a frequency spectrum of the ambient electric wave based on the ambient signal output from the reception antenna 110. The carrier sense circuit 111 includes a local generation circuit 111a, a mixer 111b, a band-pass filter 111c and a power measurement circuit 111d. The local generation circuit 111a generates a local signal. The local generation circuit 111a successively change, in a carrier sense period, the frequency of the local signal within a predetermined frequency range. The mixer 111b synthesizes the local signal generated in the local generation circuit 111a with the ambient signal output from the reception antenna 110, thereby converting the frequency of the ambient signal. A pass band of the band-pass filter 111c is sufficiently narrow than a carrier sense range described later. The band-pass filter 111c allows a frequency component within the above pass band among the signals output from the mixer 111*b* to only pass therethrough. The power measurement circuit 111*d* measures the power of the signal passed through the band-pass filter 111*c*.

The carrier control circuit 112 sets a carrier frequency based on the frequency spectrum measured in the carrier sense circuit 111, and controls the clock transmission circuit 113 so as to use a carrier signal having the thus set frequency for wireless transmission of the clock signal.

The clock transmission circuit 113 generates a clock transmission signal for wirelessly transmitting the clock signal generated by the clock generator 10. This clock transmission circuit 113 includes a carrier generation circuit 113*a* and a modulation circuit 113*b*. The carrier generation circuit 113*a* generates a carrier signal having a frequency selected in the carrier control circuit 112 under the control of the carrier control circuit 112. The modulation circuit 113*b* modulates an amplitude of the carrier signal generated in the carrier generation circuit 113*a* by use of the clock signal generated by the clock generator 10. The signal obtained in the modulation circuit 113*b* is the clock transmission signal.

The transmission antenna 114 emits, as an electric wave, the clock transmission signal output from the clock transmission circuit 113.

The reception antenna 90 receives the electric wave emitted from the transmission antenna 114 to obtain the clock transmission signal.

The clock reception circuit 91 extracts the clock signal from the clock transmission signal obtained by the reception antenna 90. The clock reception circuit 91 includes an amplifier 91*a*, a diode wave detector 91*b* and a phase locked loop (PLL) 91*c*. The amplifier 91*a* amplifies the clock transmission signal. The diode wave detector 91*b* detects an envelope curve of the clock transmission signal. The PLL 91*c* generates the clock signal having a phase synchronized with the signal detected by the diode wave detector 91*b*. The clock signal generated by the PLL 91*c* is an output of the clock reception circuit 91.

The reception coil 92 receives a magnetic resonance echo emitted from the subject 200, to obtain the electric echo signal.

The RF reception circuit 93 performs various kinds of reception processing with respect to the echo signal obtained by the reception coil 92. The RF reception circuit 93 performs a part of this reception processing synchronously with the clock signal output from the clock reception circuit 91.

The signal transmission circuit 94 digitalizes the echo signal output from the RF reception circuit 93 to obtain the echo data, and generates an echo transmission signal for wirelessly transmitting this echo data. The signal transmission circuit 94 performs a part of processing for generating the echo transmission signal, synchronously with the clock signal output from the clock reception circuit 91.

The transmission antenna 95 emits the echo transmission signal as an electric wave.

The reception antenna 115 receives the electric wave emitted from the transmission antenna 95 to obtain the echo data.

The signal reception circuit 116 extracts the echo signal from the echo transmission signal. The echo data extracted in the signal reception circuit 116 is transmitted, as the output of the wireless unit 11, to the data analyzer 12.

Next, an operation of the MRI apparatus 101 constituted in the above manner will be described. However, there will be omitted a description of an operation for generating the echo signal in the subject 200 and collecting the echo signal to reconstruct an image concerning the subject 200 based on the collected echo signal, because such an operation is the same as the case of the already existing MRI apparatus. A characteristic operation of the MRI apparatus 101 will mainly be described.

The characteristic operation of the MRI apparatus 101 is an operation for transmitting the clock signal from the wireless unit 11 to the coil side unit 9.

Meanwhile, around the MRI apparatus 101, various medical apparatuses might be present, and electric waves emitted from such medical apparatuses become ambient electric waves of the MRI apparatus 101. Moreover, electric waves coming from the outside of a room where the MRI apparatus 101 is installed might become ambient electric waves of the MRI apparatus 101.

The carrier sense circuit 111 performs carrier sense prior to the start of imaging of the subject 200. This carrier sense is to measure the frequency spectrum of the ambient electric wave within a predetermined frequency band (hereinafter referred to as the carrier sense range). It is to be noted that the carrier sense range is set so as to include almost all of frequency ranges determined as variable ranges of the carrier frequency of the clock transmission signal.

Specifically, when the above ambient electric wave reaches the reception antenna 110, the reception antenna 110 outputs the ambient signal having the same frequency as that of the ambient electric wave of the antenna. This ambient signal is synthesized with the local signal by the mixer 111*b*, whereby the frequency is converted.

The pass band width of the band-pass filter 111*c* is set to be sufficiently small with respect to the width of the carrier sense range. On the other hand, the local generation circuit 111*a* successively generates local signals having various frequencies, but values of the frequencies are determined so that different frequencies in the carrier sense range can be converted to the frequencies in the pass band of the band-pass filter 111*c* by the mixer 111*b*. Therefore, various frequency components among the ambient signals successively pass through the band-pass filter 111*c*, and are input into the power measurement circuit 111*d*. Then, the power measurement circuit 111*d* measures a power of a signal passed and input through the band-pass filter 111*c*. In this manner, the powers of the frequency components within the carrier sense range included in the ambient signal are measured, respectively, and frequency spectrums within the carrier sense range of the ambient signals are measured. It is to be noted that the frequency of a transmission signal of wireless LAN or Bluetooth (registered trademark), which is a candidate of the ambient signals, is dynamically changed sometimes by frequency hopping. Therefore, the local generation circuit 111*a* beforehand fixes at least the frequency of the local signal for a period required for selecting all the frequencies by such frequency hopping.

The above carrier sense can search for a frequency band (hereinafter referred to as the interference band) where an electric wave is present which can become an interference wave of the clock transmission signal. Therefore, the carrier control circuit 112 sets a carrier frequency as a frequency outside the interference band.

Figure 3:
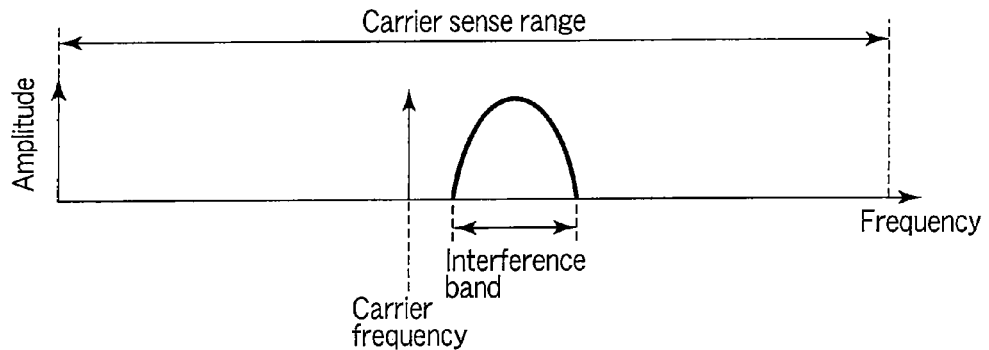
FIG. 3 is a diagram showing an example of a frequency spectrum and a setting example of a carrier frequency in the first embodiment.

FIG. 3 is a diagram showing an example of the frequency spectrum measured in the carrier sense circuit 111 and a setting example of the carrier frequency in the first embodiment.

Meanwhile, for at least a period when the echo data is collected, the carrier control circuit 112 controls the carrier generation circuit 113*a* to generate the carrier signal having the carrier frequency set in the above manner. Specifically, when the carrier generation circuit 113*a* regulates the frequency of the carrier signal by use of the PLL, a magnification ratio or division ratio in the carrier control circuit 112 is changed.

It is to be noted that the carrier sense circuit 111 performs the carrier sense every predetermined operation timing. The carrier control circuit 112 sets the carrier frequency as described above every time the carrier sense is performed, and then fixes the carrier frequency until the carrier sense is performed. The operation timing may arbitrarily be determined. That is, the operation timing can be determined in accordance with a break-point of an imaging operation, for example, every time one inspection is performed or every time data for one image is collected. Alternatively, the operation timing can be determined at a constant time interval. The operation timing may be fixedly determined, or may be changed in accordance with user's request.

The amplitude of the carrier signal generated in the carrier generation circuit 113a is modulated by the clock signal generated by the clock generator 10 in the modulation circuit 113b. In consequence, the clock transmission signal having, as a center frequency, the carrier frequency set as described above is generated in the modulation circuit 113b. Then, this clock transmission signal is transmitted through a space in the state of the electric wave by the transmission antenna 114 and the reception antenna 90.

The clock transmission signal output from the reception antenna 90 is amplified by the amplifier 91a. Furthermore, the diode wave detector 91b extracts a clock signal component from the clock transmission signal by the envelope detection. The clock signal component extracted here has a distorted waveform owing to wireless transmission. Therefore, the clock signal having the waveform regulated synchronously with the clock signal component is generated by the PLL 91c. Thus, the clock reception circuit 91 regenerates the clock signal transmitted from the clock transmission circuit 113.

In this way, in the clock reception circuit 91, the envelope curve of the modulated amplitude signal is detected, thereby removing the carrier component, so that it is not necessary to change the operation of the clock reception circuit 91 which depends on the frequency of the carrier signal. Moreover, even if the carrier frequency is changed, the characteristics of the clock signal regenerated in the clock reception circuit 91 are not affected.

The clock signal regenerated in the clock reception circuit 91 is input into the RF reception circuit 93 and the signal transmission circuit 94. On the other hand, the echo signal obtained by the reception coil 92 is subjected to analog signal processes such as filtering and amplifying in the RF reception circuit 93. Furthermore, the echo signal is subjected to signal processing for wireless transmission in the signal transmission circuit 94. Specifically, the signal transmission circuit 94 digitalizes the echo signal to convert the signal to the echo data, and then converts this echo data of a data format to the echo transmission signal of a format which conforms to a wireless standard for the wireless transmission. In this case, the processing in the RF reception circuit 93 and the signal transmission circuit 94 is performed synchronously with the clock signal obtained from the clock reception circuit 91.

The echo transmission signal obtained in the signal transmission circuit 94 is transmitted through the space in the state of the electric wave by the transmission antenna 95 and the reception antenna 115. The signal reception circuit 116 extracts a signal component indicating the echo data from the echo transmission signal obtained by the reception antenna 115, and identifies the echo data from the signal component. In this case, the processing in the signal reception circuit 116 is executed synchronously with the clock signal generated by the clock generator 10.

As described above, according to the first embodiment, the frequency of the carrier signal, which is used for wireless transmission of the clock signal from the wireless unit 11 to the coil side unit 9, is set to be different from the frequency of the ambient electric wave. Therefore, interference between the clock transmission signal and the ambient electric wave can securely be lowered, and deterioration of the clock transmission signal due to such interference can be decreased. In consequence, the clock reception circuit 91 can regenerate the clock signal accurately synchronized with the clock signal generated by the clock generator 10. Moreover, the RF reception circuit 93 and the signal transmission circuit 94, together with the signal reception circuit 116, utilize the accurately synchronized clock signal described above, whereby the signal reception circuit 116 can accurately identify the echo data transmitted from the coil side unit 9. Consequently, the data analyzer 12 can reconstruct an image based on the echo data having little error to obtain the accurate image.

Second Embodiment

An MRI apparatus 101 according to a second embodiment has a constitution shown in FIG. 1 and FIG. 2 in the same manner as in the MRI apparatus 101 of the first embodiment.

The MRI apparatus 101 of the second embodiment is different from the first embodiment only in point of processing in a carrier control circuit 112. Therefore, characteristic parts of the second embodiment will only be described hereinafter.

To begin with, a clock transmission signal of the first embodiment is obtained by modulating the amplitude of a carrier signal with a clock signal. Therefore, the clock transmission signal includes components of frequencies Fca, Fca+Fck and Fca−Fck, in which Fca is the frequency of the carrier signal and Fck is the frequency of the clock signal. However, the frequency Fca is merely determined outside an interference band, and hence the components of the frequencies Fca+Fck and Fca−Fck might fall within the interference band. Needless to say, even in this case, an interference wave due to an ambient electric wave is noticeably decreased as compared with a case where the frequency Fca is within the interference band, and hence the above-mentioned effect of the first embodiment is sufficiently achieved. However, if the components of Fca+Fck and Fca−Fck interfere with the ambient electric wave, the effect of the first embodiment might partially be impaired.

To solve the problem, the carrier control circuit 112 of the MRI apparatus sets the carrier frequency Fca so that the frequency is distant from the interference band as much as the clock frequency Fck or more. Specifically, the carrier control circuit 112 sets the carrier frequency Fca as a frequency obtained by subtracting a regulated value of the clock frequency Fck or more from a lower limit frequency of the interference band, or as a frequency obtained by adding the clock frequency Fck to an upper limit frequency of the interference band.

Figure 4:
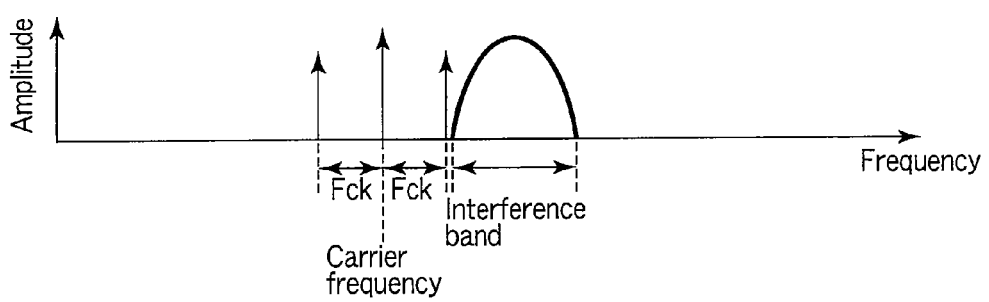
FIG. 4 is a diagram showing an example of the frequency spectrum and a setting example of the carrier frequency in a second embodiment.

FIG. 4 is a diagram showing an example of a frequency spectrum measured in a carrier sense circuit 111 and a setting example of the carrier frequency in the second embodiment.

Therefore, according to this second embodiment, all the components of the frequencies Fca, Fca+Fck and Fca−Fck included in the clock transmission signal are present outside the interference band, so that the second embodiment can achieve the same effect as in the first embodiment more efficiently than the first embodiment.

Third Embodiment

An MRI apparatus 101 according to a third embodiment has a constitution shown in FIG. 1 and FIG. 2, as in the MRI apparatus 101 of the first embodiment.

The MRI apparatus 101 of the third embodiment is different from the first embodiment in point of processes in a carrier sense circuit 111 and a carrier control circuit 112. Therefore, characteristic parts of the third embodiment will only be described hereinafter.

To begin with, as ambient electric waves, a plurality of electric waves of mutually different frequency bands are mixed sometimes. Moreover, in such a case, an appropriate carrier frequency might not be set in the first or second embodiment. That is, the carrier frequency might be set so that interference with the ambient electric waves of a certain interference band can sufficiently be lowered, but interference with the ambient electric waves of another interference band cannot sufficiently be lowered.

To solve the problem, the carrier sense circuit 111 of the MRI apparatus 101 determines each of a plurality of frequencies at which powers are measured so that there is surely present another measurement target frequency which is distant from the above measurement target frequency as much as the clock frequency Fck. Furthermore, the band-pass filter 111c has steep frequency passing characteristics in an intermediate frequency (IF) band. In this case, it is considered that as the band-pass filter 111c, an SAW filter or the like is applied.

Figure 5:
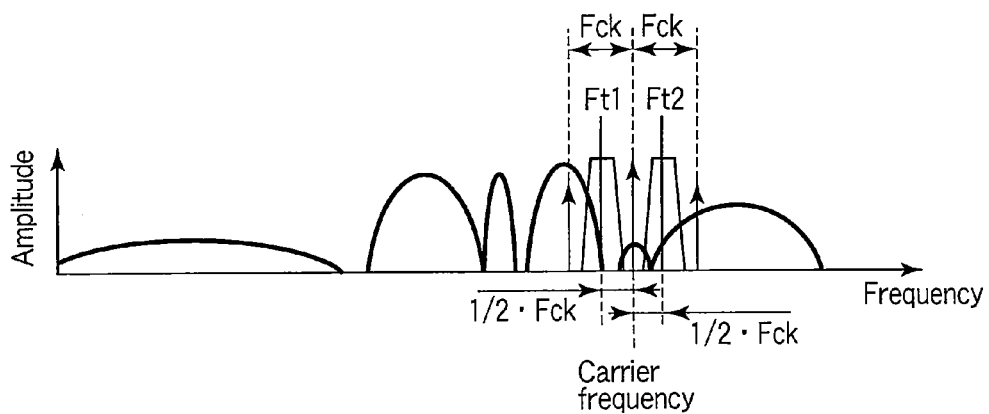
FIG. 5 is a diagram showing an example of the frequency spectrum and a setting example of the carrier frequency in a third embodiment.

On the other hand, the carrier control circuit 112 calculates a sum of powers (hereinafter referred to as the power sum) measured at each of two frequencies of a plurality of pairs of frequencies comprising two measurement target frequencies which are distant from each other as much as the clock frequency Fck. Then, the carrier control circuit 112 selects a minimum value from the plurality of obtained power sums, and sets, as a carrier frequency, an intermediate value between the two frequencies of the pair of frequencies corresponding to the minimum value. That is, the carrier control circuit 112 sets, as the carrier frequency, the frequency having a minimum power sum with respect to two frequency bands each having ±½×Fck as a center frequency. FIG. 5 is a diagram showing an example of a frequency spectrum measured in the carrier sense circuit 111 and a setting example of the carrier frequency in the third embodiment.

In FIG. 5, frequencies Ft1 and Ft2 are a pair of frequencies having the minimum power sum measured at the frequencies. Moreover, the carrier frequency has an intermediate value between the frequencies Ft1 and Ft2.

Figure 6:
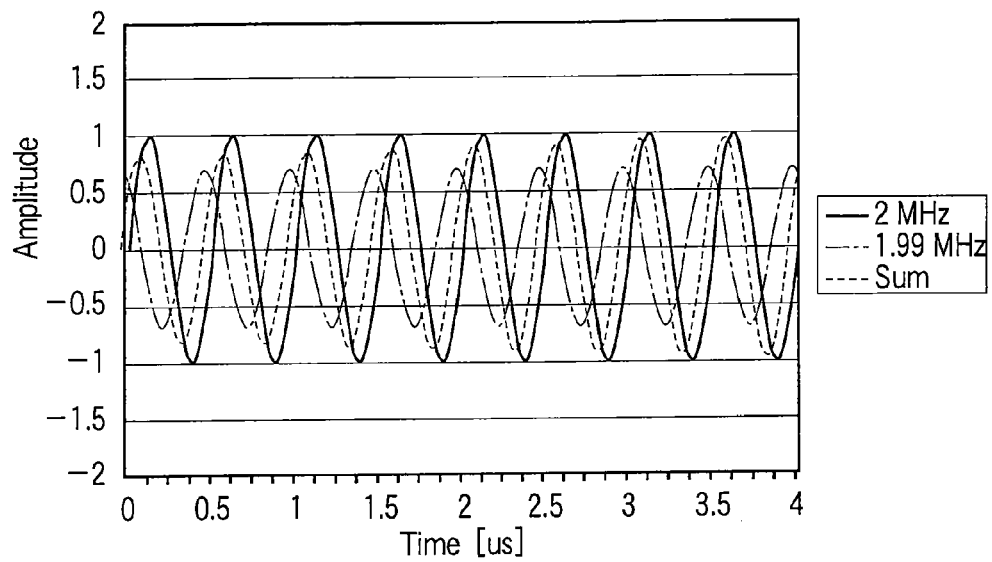
FIG. 6 is a diagram in which waveforms of a clock signal, an interference wave and a sum signal are compared and shown.
Figure 7:
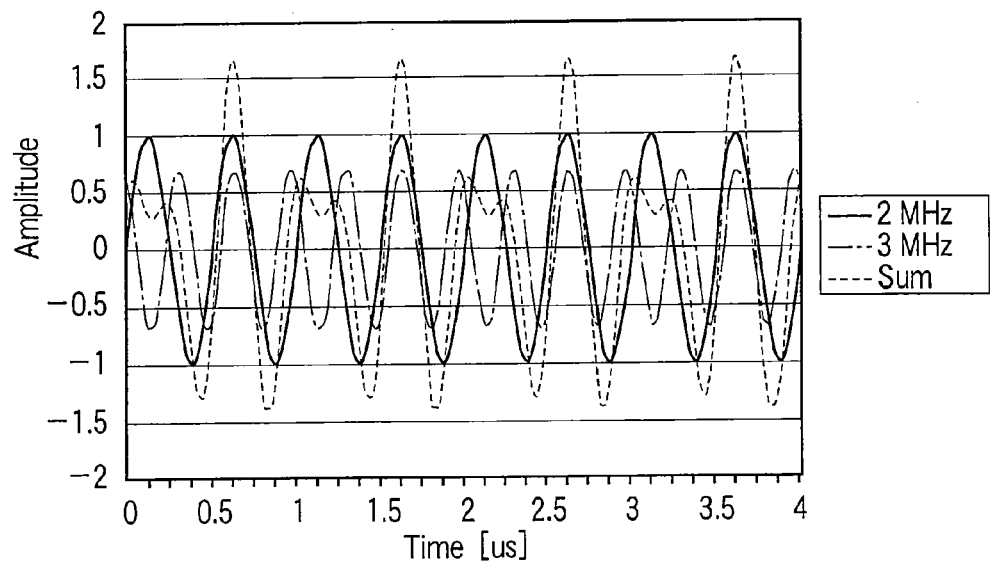
FIG. 7 is a diagram in which the waveforms of the clock signal, the interference wave and the sum signal are compared and shown.
Figure 8:
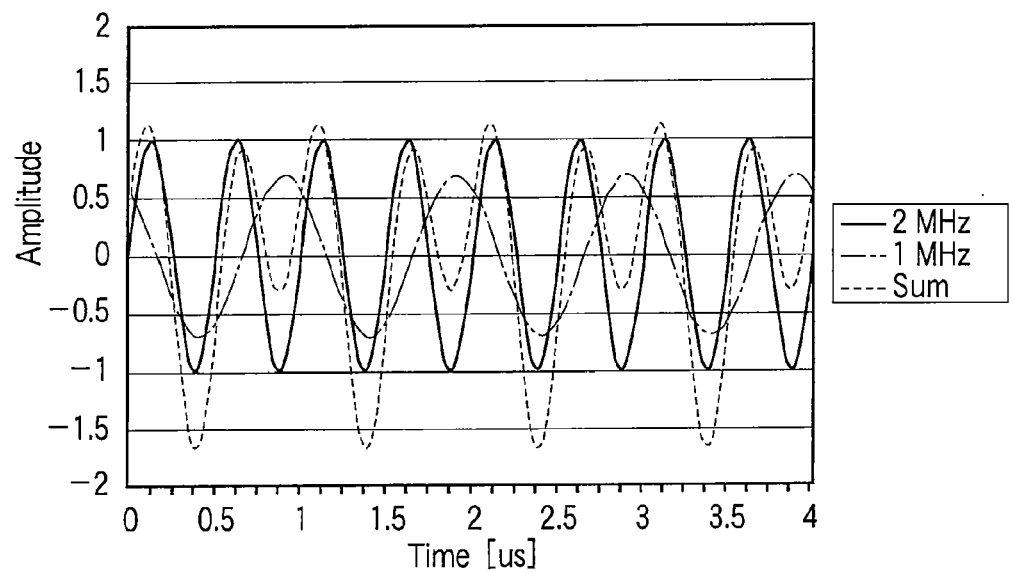
FIG. 8 is a diagram in which the waveforms of the clock signal, the interference wave and the sum signal are compared and shown.

Here, when the clock frequency Fck is, for example, 2 MHz, attention is to be paid to a case where interference waves of 1.99 MHz, 3 MHz and 1 MHz are present. FIG. 6, FIG. 7 and FIG. 8 are diagrams showing that waveforms of a clock signal, an interference wave and a sum signal of the clock signal and the interference wave are compared in a case where interference frequencies are 1.99 MHz, 3 MHz and 1 MHz, respectively.

In a case where the interference frequency is 1.99 MHz or 3 MHz, when comparison is performed after AC coupling, a signal of 2 MHz can be demodulated from the sum signal shown in FIG. 6 and FIG. 7. On the other hand, in a case where the interference frequency is 1 MHz, even when the comparison is performed after the AC coupling, the signal of 2 MHz cannot be demodulated from the sum signal shown in FIG. 8.

Figure 9:
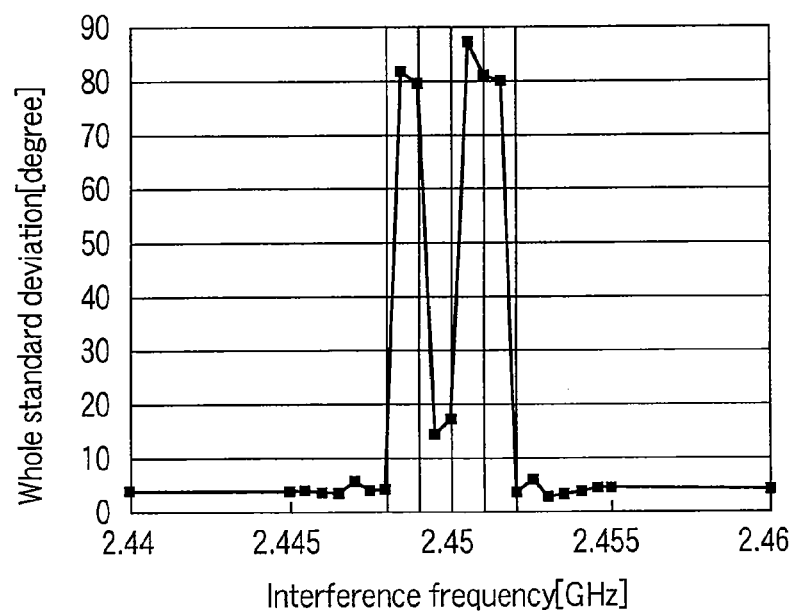
FIG. 9 is a diagram showing the measurement result of a clock accuracy with respect to an interference frequency.

FIG. 9 is a diagram showing the measurement result of a clock accuracy with respect to the interference frequency in a case where the clock frequency is 2 MHz and the carrier frequency is 2.45 GHz.

Also from this measurement result shown in FIG. 9, it is seen that the clock accuracy most deteriorates in a case where the interference wave is present at the carrier frequency ±½× the clock frequency.

In the third embodiment, properties peculiar to such amplitude modulation are utilized to lower the interference due to the ambient electric waves. That is, when the carrier frequency is set as described above, the interference wave present at the carrier frequency ±½× the clock frequency becomes smallest, and influence of the interference due to the ambient electric waves can be minimized.

In consequence, according to the third embodiment, the carrier frequency can be set so that the interference due to the ambient electric waves can be lowered most, even in a situation where a number of interference bands are present as shown in FIG. 5. Furthermore, the carrier frequency can be set in this manner to achieve an effect similar to that of the first embodiment.

Fourth Embodiment

A schematic constitution of an MRI apparatus 102 according to a fourth embodiment is similar to that of the MRI apparatus 101 of the first embodiment. Moreover, the MRI apparatus 102 is different from the MRI apparatus 101 in constitutions of a coil side unit 9 and a wireless unit 11.

FIG. 10 is a block diagram showing a constitution of a main part of the MRI apparatus 102. It is to be noted that in FIG. 10, the same part as that of FIG. 1 and FIG. 2 is denoted with the same reference numerals, and detailed description thereof is omitted.

The coil side unit 9 of the MRI apparatus 102 comprises a reception antenna 90, a clock reception circuit 91, a reception coil 92, an RF reception circuit 93, a signal transmission circuit 94, a transmission antenna 95, a reception antenna 96, an information reception circuit 97 and a regeneration control circuit 98. That is, the coil side unit 9 of the MRI apparatus 102 has a constitution in which the reception antenna 96, the information reception circuit 97 and the regeneration control circuit 98 are further added to the constitution of the MRI apparatus 101.

Moreover, the wireless unit 11 includes a reception antenna 110, a carrier sense circuit 111, a clock transmission circuit 113, a transmission antenna 114, a reception antenna 115, a signal reception circuit 116, a carrier control circuit 117, a frequency conversion circuit 118, an information transmission circuit 119 and a transmission antenna 120. That is, the wireless unit 11 of the MRI apparatus 102 comprises the carrier control circuit 117 in place of the carrier control circuit 112 of the MRI apparatus 101, and additionally comprises the frequency conversion circuit 118, the information transmission circuit 119, and the transmission antenna 120.

The carrier control circuit 117 sets a conversion ratio (a magnification ratio or a division ratio) of a clock signal based on a frequency spectrum obtained in the carrier sense circuit 111, and controls the frequency conversion circuit 118 so as to convert the frequency of the clock signal at the conversion ratio. Moreover, the carrier control circuit 117 sets a carrier frequency based on the frequency spectrum obtained in the carrier sense circuit 111, and controls the clock transmission circuit 113 so as to use a carrier signal having the frequency for wireless transmission of the clock signal. Furthermore, the carrier control circuit 117 transfers, to the information transmission circuit 119, frequency information indicating the frequency of the clock signal for the wireless transmission.

The frequency conversion circuit 118 converts the frequency of the clock signal generated by a clock generator 10 under the control of the carrier control circuit 117. The frequency conversion circuit 118 transfers the clock signal having the converted frequency to the clock transmission circuit 113. It is to be noted that the frequency conversion circuit 118 may set the conversion ratio of the frequency to 1. That is, the frequency conversion circuit 118 can output the clock signal generated by the clock generator 10 with the frequency of the generated clock signal as it is.

The information transmission circuit 119 generates an information transmission signal for wireless transmission of the frequency information.

The transmission antenna 120 emits the information transmission signal as an electric wave.

The reception antenna 96 receives the electric wave emitted from the transmission antenna 120 to obtain the information transmission signal.

The information reception circuit 97 extracts the frequency information from the information transmission signal.

The regeneration control circuit 98 controls, based on the frequency information, regeneration processing of the clock signal in the clock reception circuit 91.

Next, an operation of the MRI apparatus 102 having the above constitution will be described. It is to be noted that a greater part of the operation of the MRI apparatus 102 is similar to the operation of the MRI apparatus 101 of the third embodiment, and hence description of such an operation will be omitted. A characteristic operation of the MRI apparatus 102 will mainly be described.

The MRI apparatus 101 transmits the clock signal generated by the clock generator 10 as it is, by a clock transmission signal. On the other hand, the MRI apparatus 102 comprises the frequency conversion circuit 118, whereby the clock signal generated by the clock generator 10 can be transmitted as it is, by the clock transmission signal, but the clock signal having the converted frequency may be transmitted by the clock transmission signal. Moreover, the frequency of the clock signal transmitted by the clock transmission signal is changed, whereby a combination of two measurement target frequencies of the pair of frequencies changes.

To this end, a plurality of measurement target frequencies are beforehand determined so that a plurality of frequency pairs are present among a plurality of clock frequencies. Then, the carrier control circuit 117 performs processing for calculating power sums of the plurality of frequency pairs in the same manner as in the third embodiment, based on the frequency spectrum measured in the carrier sense circuit 111, with respect to the plurality of clock frequencies which are targets. The carrier control circuit 117 selects a minimum value from all the calculated power sums, sets, as the carrier frequency, an intermediate value between two frequencies of the frequency pair corresponding to the value, and sets, as the frequency of the clock signal to be transmitted, the clock frequency concerned with the frequency pair.

Figure 11:
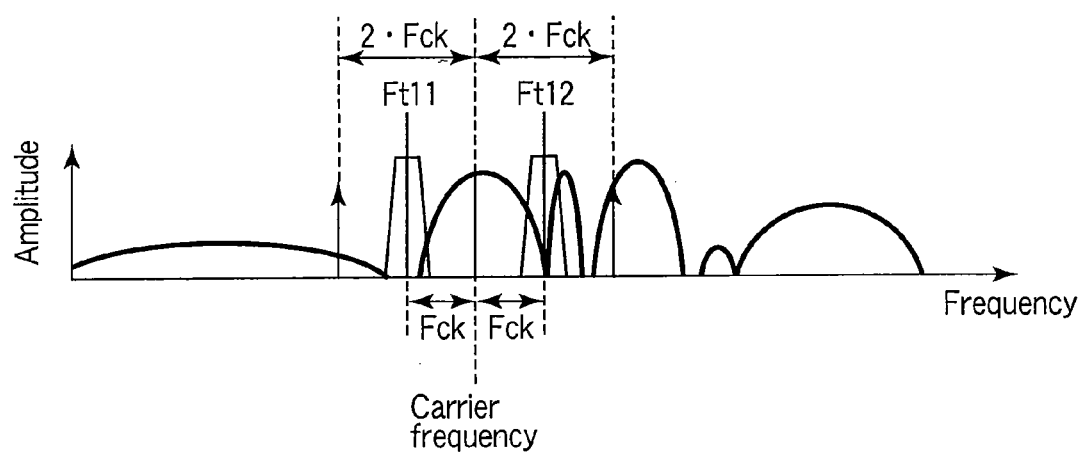
FIG. 11 is a diagram showing an example of the frequency spectrum and a setting example of the carrier frequency in the fourth embodiment.

Specifically, the frequency conversion circuit 118 can multiply the clock signal generated by the clock generator 10 twice to generate the clock signal having a frequency of 2×Fck. In this case, in addition to the power sums with respect to the plurality of frequency pairs each comprising two measurement target frequencies having a relation between the measurement target frequencies Ft1 and Ft2 shown in FIG. 5, power sums are calculated with respect to a plurality of frequency pairs each comprising two measurement target frequencies having a relation between measurement target frequencies Ft11 and Ft12 shown in FIG. 11. Moreover, if, for example, the power sum of a frequency pair comprising the measurement target frequencies Ft1 and Ft2 has a minimum value, the carrier frequency shown in FIG. 5 is set as an intermediate value between the frequencies Ft1 and Ft2, and the frequency of the clock signal to be transmitted is set to Fck. On the other hand, if the power sum of a frequency pair comprising the measurement target frequencies Ft11 and Ft12 has a minimum value, the carrier frequency shown in FIG. 11 is set as an intermediate value between the frequencies Ft11 and Ft12, and the frequency of the clock signal to be transmitted is set to 2×Fck.

The carrier control circuit 117 controls the operation of a carrier generation circuit 113a in the same manner as in the first embodiment. Moreover, the carrier control circuit 117 controls the conversion ratio in the frequency conversion circuit 118 so as to transfer the clock signal having the set frequency from the frequency conversion circuit 118 to a modulation circuit 113b. Specifically, when the carrier control circuit 117 sets the frequency of the clock signal to be transmitted to Fck as described above, the circuit sets the magnification ratio to 1. When the circuit sets the frequency of the clock signal to be transmitted to 2×Fck, the circuit controls the frequency conversion circuit 118 so as to set the magnification ratio to 2.

On the other hand, the carrier control circuit 117 transfers, to the information transmission circuit 119, the frequency information indicating the frequency of the clock signal to be transmitted. The frequency information may indicate the frequency value of the clock signal to be transmitted, or the conversion ratio in the frequency conversion circuit 118. This frequency information is transferred to the regeneration control circuit 98 via the information transmission circuit 119, the transmission antenna 120, the reception antenna 96 and the information reception circuit 97. The regeneration control circuit 98 regulates the division ratio or the magnification ratio of a PLL 91c based on the frequency information so that the clock signal having the frequency Fck is output from the PLL 91c. Specifically, the regeneration control circuit 98 sets the division ratio of the PLL 91c to, for example, 1 in a case where the frequency information indicates the frequency Fck, and sets the division ratio of the PLL 91c to 2 in a case where the frequency information indicates the frequency 2×Fck. In consequence, when the clock signal having the frequency converted by the frequency conversion circuit 118 is transmitted, the clock signal generated by the clock generator 10 is regenerated based on the transmitted clock signal.

As described above, according to the fourth embodiment, the frequency of the clock signal to be transmitted can be changed, whereby it is possible to change a degree of interference with ambient electric waves in a case where the same carrier frequency is used. Moreover, a combination of the frequency of the clock signal to be transmitted and the carrier frequency is selected to minimize the interference with the ambient electric waves. Therefore, conditions for minimizing the interference with the ambient electric waves can be selected from more conditions as compared with the third embodiment, and the interference with the ambient electric waves can further efficiently be lowered.

Fifth Embodiment

A schematic constitution of an MRI apparatus 103 according to a fifth embodiment is similar to the MRI apparatus 101 of the first embodiment. Moreover, the MRI apparatus 103 is different from the MRI apparatus 101 in constitutions of a coil side unit 9 and a wireless unit 11.

FIG. 12 is a block diagram showing a constitution of a main part of the MRI apparatus 103. It is to be noted that the same part of FIG. 12 as FIG. 1, FIG. 2 and FIG. 10 is denoted with the same reference numerals, and detailed description thereof is omitted.

The coil side unit 9 of the MRI apparatus 103 comprises a reception antenna 90, a clock reception circuit 91, a reception coil 92, an RF reception circuit 93, a signal transmission circuit 94, a transmission antenna 95 and a clock determination circuit 99. That is, in the coil side unit 9 of the MRI apparatus 103, the clock determination circuit 99 is further added to the constitution of the MRI apparatus 101.

Moreover, the wireless unit 11 includes a reception antenna 110, a carrier sense circuit 111, a clock transmission circuit 113, a transmission antenna 114, a reception antenna 115, a signal reception circuit 116, a carrier control circuit 117 and a frequency conversion circuit 118. That is, the wireless unit 11 of the MRI apparatus 103 comprises the carrier control circuit 117 in place of the carrier control circuit 112 of the MRI apparatus 101, and additionally comprises the frequency conversion circuit 118. That is, in the wireless unit 11 of the MRI apparatus 103, the information transmission circuit 119 and the transmission antenna 120 of the MRI apparatus 102 are omitted.

The clock determination circuit 99 includes a clock generation circuit 99a and a frequency comparison circuit 99b. The clock generation circuit 99a generates a clock signal (hereinafter referred to as the self-sustainable signal) asynchronously from a clock signal generated by a clock generator 10 or a transmitted clock signal, i.e., in a self-sustainable manner. The frequency comparison circuit 99b measures a frequency ratio between a signal detected by a diode wave detector 91b and the self-sustainable clock signal. Then, the frequency comparison circuit 99b sets a magnification ratio or a division ratio to a PLL 91c in accordance with the measured frequency ratio.

Next, an operation of the MRI apparatus 103 having the above constitution will be described. It is to be noted that a greater part of the operation of the MRI apparatus 103 is similar to the operation of the MRI apparatus 102, and hence description of such an operation is omitted. A characteristic operation of the MRI apparatus 103 will mainly be described.

Here, the operation of the MRI apparatus 103 is different from that of the MRI apparatus 102 in that the frequency of the clock signal to be transmitted is not notified from the wireless unit 11 to the coil side unit 9, but the frequency is determined in the coil side unit 9.

The clock generation circuit 99a generates the self-sustainable clock signal having a frequency with a known ratio with respect to the frequency of the clock signal generated by the clock generator 10. Therefore, if the clock signal generated by the clock generator 10 is transmitted as it is, the frequency ratio between the signal detected by the diode wave detector 91b and the self-sustainable clock signal is the above known ratio. On the other hand, if the clock signal having the frequency converted by the frequency conversion circuit 118 is transmitted, the frequency ratio between the signal detected by the diode wave detector 91b and the self-sustainable clock signal noticeably shifts from the above known ratio. Moreover, this shift ratio has a size corresponding to the conversion ratio in the frequency conversion circuit 118. Therefore, the frequency comparison circuit 99b can determine the magnification ratio or the division ratio based on the frequency ratio of the PLL 91c between the signal detected by the diode wave detector 91b and the self-sustainable clock signal, for example, by threshold value processing, with reference to a table or the like.

In consequence, according to the fifth embodiment, an effect similar to that of the fourth embodiment can be achieved. Furthermore, according to the fifth embodiment, frequency information does not have to be transmitted, whereby constituent elements for the purpose can be omitted. The constitutions of the coil side unit 9 and wireless unit 11 can be simplified as compared with the fourth embodiment.

This embodiment can variously be modified or implemented.

For example, when a carrier generation circuit 113a incorporates a PLL, a local generation circuit 111a may be omitted, and a local signal may be generated by the above PLL.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetic resonance imaging apparatus comprising:
    a reception coil which receives a magnetic resonance echo emitted from a subject, to output an echo signal;
    a clock generator which generates a clock signal;
    an echo transmitter which generates and transmits an echo transmission signal to wirelessly transmit the echo signal, and performs at least a part of processing to generate the echo transmission signal synchronously with the clock signal;
    a carrier generator which generates a carrier signal, a frequency of the carrier signal being configured to be changed within a variable range;
    a clock transmitter which wirelessly transmits a clock transmission signal obtained by modulating the carrier signal with the clock signal;
    a regenerator which regenerates the clock signal based on the clock transmission signal transmitted by the clock transmitter;
    an echo receiver which extracts the echo signal from the echo transmission signal transmitted by the echo transmitter, and performs a part of processing to extract the echo signal synchronously with the clock signal regenerated by the regenerator;
    a reconstruction unit which reconstructs an image concerning the subject based on the echo signal extracted by the receiver;
    a detector which detects a frequency of an electric wave which becomes an interference wave of the clock transmission signal; and
    a controller which selects, from the variable range, a frequency having comparatively small interference with respect to the frequency detected by the detector, and controls the carrier generator to generate the carrier signal having the selected frequency.

2. The apparatus of claim 1, wherein the controller selects a frequency which is distant from the frequency detected by the detector as much as the frequency of the clock signal or more.

3. The apparatus of claim 1, wherein the controller selects a frequency from frequencies within the variable range, such that a sum of powers of electric waves in two preset-width frequency bands centered at frequencies higher and lower than the selected frequency by ½ of the frequency of the clock signal is smaller than sums of powers obtained likewise with respect to unselected frequencies.

4. A magnetic resonance imaging apparatus comprising:
a reception coil which receives a magnetic resonance echo emitted from a subject, to output an echo signal;
a clock generator which generates a reference clock signal;
an echo transmitter which generates and transmits an echo transmission signal to wirelessly transmit the echo signal, and performs at least a part of processing to generate the echo transmission signal synchronously with the clock signal;
a converter which converts a frequency of the clock signal generated in the clock generator to obtain at least one clock signal for transmission;
a carrier generator which generates a carrier signal, a frequency of the carrier signal being configured to be changed within a variable range;
a calculator which calculates a minimum value of a first value regarding frequencies within the variable range and a minimum value of a second value regarding the frequencies within the variable range, the first value being obtained as a sum of powers of electric waves in two preset-width frequency bands centered at frequencies higher and lower than a given frequency by ½ of the frequency of the reference clock signal, the second value being obtained as a sum of powers of electric waves in two preset-width frequency bands centered at frequencies higher and lower than a given frequency by ½ of the frequency of the transmission clock signal;
a controller which determines a smaller value between two minimum values calculated by the calculator, and controls the carrier generator such that the carrier signal having a frequency corresponding to the smaller value is generated;
a clock transmitter which wirelessly transmits a clock transmission signal obtained by modifying the carrier signal with the reference clock signal, if the smaller value between the two minimum values is the minimum value of the first value, and wirelessly transmits a clock transmission signal obtained by modifying the carrier signal with the transmission clock signal, if the smaller value between the two minimum values is the minimum value of the second value;
a regenerator which regenerates the reference clock signal based on the clock transmission signal transmitted by the clock transmitter;
an echo receiver which extracts the echo signal from the echo transmission signal transmitted by the echo transmitter, and performs a part of processing to extract the echo signal synchronously with the reference clock signal regenerated by the regenerator; and
a reconstruction unit which reconstructs an image concerning the subject based on the echo signal extracted by the receiver.

5. The apparatus of claim 4, further comprising:
a supplier which supplies the regenerator with frequency information indicating the frequency of the clock signal used by the clock transmitter to obtain the clock transmission signal,
wherein the regenerator converts the frequency of the clock signal included in the clock transmission signal based on a ratio between the frequency indicated by the frequency information and the frequency of the reference clock signal, to regenerate the reference clock signal.

6. The apparatus of claim 4, further comprising:
a determiner which determines the frequency of the clock signal included in the clock transmission signal,
wherein the regenerator converts the frequency of the clock signal included in the clock transmission signal based on a ratio between the frequency determined by the determiner and the frequency of the reference clock signal, to regenerate the reference clock signal.

7. A magnetic resonance imaging apparatus comprising:
a reception coil which receives a magnetic resonance echo emitted from a subject, to output an echo signal;
a clock generator which generates a clock signal;
an echo transmitter which generates and transmits an echo transmission signal to wirelessly transmit the echo signal, and performs at least a part of processing to generate the echo transmission signal synchronously with the clock signal;
a carrier generator which generates a carrier signal, a frequency of the carrier signal being configured to be changed within a variable range;
a clock transmitter which wirelessly transmits a clock transmission signal obtained by modulating the carrier signal with the clock signal;
a regenerator which regenerates the clock signal based on the clock transmission signal transmitted by the clock transmitter;
an echo receiver which extracts the echo signal from the echo transmission signal transmitted by the echo transmitter, and performs a part of processing to extract the echo signal synchronously with the clock signal regenerated by the regenerator;
a reconstruction unit which reconstructs an image concerning the subject based on the echo signal extracted by the receiver;
a detector which detects a frequency of an electric wave which becomes an interference wave of the clock transmission signal; and
a controller which selects, from the variable range, a frequency having comparatively small interference with respect to the frequency detected by the detector, and controls the carrier generator to generate the carrier signal having the selected frequency, wherein the controller selects a frequency from frequencies within the variable range, such that a sum of powers of electric waves in two preset-width frequency bands centered at frequencies higher and lower than the selected frequency by ½ of the frequency of the clock signal is smaller than sums of powers obtained likewise with respect to unselected frequencies.

* * * * *

UNITED STATES PATENT AND TRADEMARK OFFICE
CERTIFICATE OF CORRECTION

PATENT NO.        : 8,643,362 B2
APPLICATION NO.   : 13/048314
DATED             : February 4, 2014
INVENTOR(S)       : Sekiguchi et al.

Page 1 of 1

It is certified that error appears in the above-identified patent and that said Letters Patent is hereby corrected as shown below:

On the Title Page under "Assignee":

Item (73) -- please correct: "Kabushiki Kaisha Toshiba, Minato-ku, Tokyo (JP)" to -- Kabushiki Kaisha Toshiba, Minato-ku, Tokyo (JP) *and* Toshiba Medical Systems Corporation, Otawara-shi, Tochigi (JP) --.

Signed and Sealed this
Twenty-second Day of September, 2015

Michelle K. Lee
*Director of the United States Patent and Trademark Office*